United States Patent [19]

Peil et al.

[11] 3,750,042

[45] July 31, 1973

[54] AMPLIFIER OF CONTROLLABLE GAIN

[75] Inventors: William Peil, North Syracuse; Robert J. McFadyen, Syracuse, both of N.Y.

[73] Assignee: General Electric Company, Syracuse, N.Y.

[22] Filed: Aug. 21, 1972

[21] Appl. No.: 282,451

[52] U.S. Cl. ............... 330/29, 178/5.4 AC, 330/28, 330/30 D, 330/85

[51] Int. Cl. ............................................ H03g 3/30

[58] Field of Search ..................... 330/29, 30 D, 28, 330/85, 69; 325/319; 178/5.4 AC

[56] References Cited

UNITED STATES PATENTS 3,452,289 6/1969 Ryan ............................... 330/29 X

*Primary Examiner*—Roy Lake
*Assistant Examiner*—James B. Mullins
*Attorney*—Richard V. Lang et al.

[57] ABSTRACT

A voltage controlled A.C. amplifier is described particularly suited for automatic gain control applications and in particular to automatic color control in a color television receiver. The amplifier is adapted for IC fabrication, with D.C. coupling throughout, having a minimum pin count, and a minimum of outboarded components. While the A.C. signal gain of the amplifier is controllable by voltage adjustment, the D.C. gain is substantially unity. The amplifier takes the form of a modified four-quadrant multiplier with two upper rank differentially connected transistor pairs whose emitters are driven by a lower rank differentially connected transistor pair, the latter preferably flanked by a pair of emitter followers. The input signal is normally applied to the base of one flanking emitter follower through a high pass coupling network. The gain control function is achieved by selective regenerative or degenerative feedback controlled by the interbase potential applied to the upper rank transistor pair. The feedback is applied to the lower rank transistors through a feedback network which is balanced for D.C. but which has a differential affect for A.C. and in particular a low pass coupling characteristic to the lower rank transistor to which the input signal is coupled.

6 Claims, 2 Drawing Figures

AMPLIFIER OF CONTROLLABLE GAIN

BACKGROUND OF THE INVENTION

1. Field of the Invention

The invention relates to variable gain amplifiers and more particularly to variable gain amplifiers whose amplification is subject to voltage control. The amplifier finds typical application in an automatic gain control network wherein an error or control voltage of suitable polarity is derived to hold the amplifier output to a stable amplitude. One such application is the amplitude stabilization of the color signal applied to the modulators of a color television receiver. The amplitude of the color signal while varying from line to line is standardized in relation to the burst which is transmitted at a constant level.

2. Description of the Prior Art

The classic variable gain amplifier was a vacuum tube of variable mu, the variability being a property of the electrode geometry. This property was normally brought into operation by careful adjustment of average D.C. levels at the input of the amplifier while the signal level was held small in comparison. In semiconductors, the input characteristics of the customary transistors have also provided a useful nonlinear quality for gain control purposes. Thus, a very common simple variable gain device has been voltage controlled diodes, often used in push-pull pairs. In single junction devices, the nonlinear property can of course be carefully optimized. More recently, in a transistor AGC amplifier, the variable gain has been achieved by a feedback control supplemented by nonlinearity in the cut off and saturation regions of the component transistors. An amplifier of this nature is described in U. S. Pat. application No. 197,390 of Mr. William Peil, entitled "Amplifier of Controllable Gain," assigned to the Assignee of the present invention.

The present invention does not depend upon individual device nonlinearity but rather upon the voltage controlled use of feedback.

SUMMARY OF THE INVENTION

It is accordingly an object of the present invention to provide an improved A.C. signal amplifier whose amplification is voltage controlled.

It is a further object of the present invention to provide an improved voltage controlled A.C. signal amplifier that is particularly adapted for use in an automatic gain control network.

It is another object of the present invention to provide a voltage controlled A.C. signal amplifier optimally suited for integrated circuit fabrication.

It is still another object of the present invention to provide an improved voltage controlled A.C. signal amplifier having negligible D.C. gain which is D.C. coupled throughout and suited for integrated circuit fabrication.

It is an object of the invention to provide an AGC amplifier having an adaptive filtering response, exhibiting a maximum selectivity at maximum gain setting.

It is a further object of the present invention to provide a voltage controlled A.C. signal amplifier having negligible D.C. gain, adapted for use in an automatic gain control network.

It is an additional object of the present invention to provide an improved automatic gain control network suitable for automatic color control in a television receiver.

These and other objects of the invention are achieved in an amplifier of controllable A.C. signal gain comprising a first and a second pair of transistors in an upper rank, the emitters of each transistor pair being joined; one collector of a transistor in each pair being joined and coupled through a common load impedance to a source of D.C. bias potential; a lower rank transistor pair having its emitters paired and led to a current source for mutually complemented signal coupling, the collector of each lower rank transistor being connected to control the emitter current in one upper rank transistor pair; means coupling an A.C. input signal to the base of a first lower rank transistor, said coupling means having a high pass characteristic and presenting a complex input impedance to said base, said lower rank transistors forming mutually complemented signals in the emitter current of each upper rank transistor pair; means for applying a D.C. interbase potential to each upper rank transistor pair, balanced at said load impedance for adjusting the relative proportions of said complemented signals in the composite signal in said load; means for coupling said composite signal to both bases of said lower rank transistors in a feedback network which is symmetrical from a D.C. standpoint to provide negligible interbase potential and which from an A.C. standpoint is nonsymmetrical at signal frequencies as a result of imbalance by said complex input impedance to provide substantial interbase feedback potential, the amount and phase thereof being adjustable by said interbase control potential; and output means coupled between like input electrodes of said lower rank transistor pair for deriving an output signal whose amplitude reflects said interbase control potential.

In accordance with other aspects of the invention the high pass coupling means comprises a serially connected capacitance and resistance coupling the input signal to the base of the first transistor and also presenting a low pass characteristic to the feedback network. The feedback is preferably applied from an emitter follower whose emitter is coupled to each lower rank transistor through like valued serial feedback resistance. A pair of emitter followers may also be provided for coupling the feedback signal to the lower rank transistors. In order to maintain stability, the allowable amplification of the amplifier is adjusted to limits established by a suitable choice of the serial signal resistance, the internal source resistance and a serial feedback resistance. The amplifier is adjusted to provide adaptive frequency selective characteristic, peaking at the center of the signal frequency under maximum gain conditions by proper parameter selection.

BRIEF DESCRIPTION OF THE DRAWING

The novel and distinctive features of the invention are set forth in the claims appended to the present application. The invention itself, however, together with the further objects and advantages thereof may be best understood by reference to the following description and accompanying drawings in which:

DESCRIPTION OF THE PREFERRED EMBODIMENT

Figure 1:
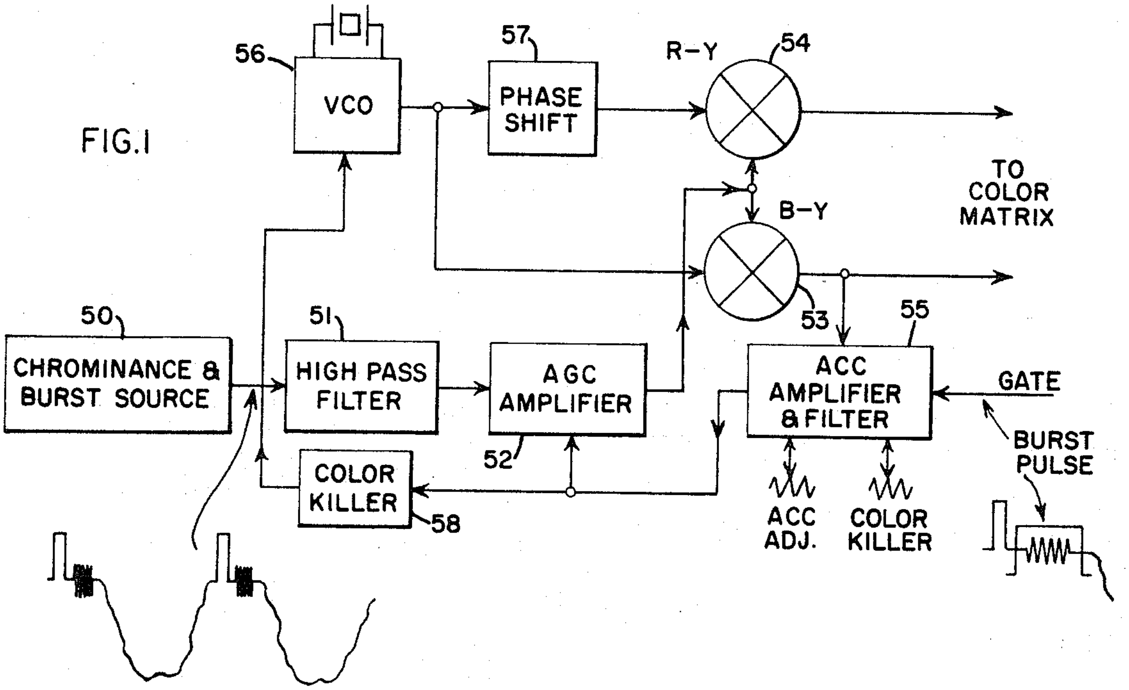
FIG. 1 is a block diagram of a portion of a color television receiver wherein the present novel voltage controlled amplifier finds typical application.

A block diagram of a portion of a television receiver in which the present novel automatic gain control amplifier may be employed is illustrated in FIG. 1. In particular, the illustration includes that portion of the television receiver which demodulates the color portions of the television signal and which includes the automatic color control loop which standardizes the amplitude of the demodulated color terms by sensing the amplitude of the burst in the demodulator output.

The block diagram may be seen to comprise the nine elements 50 through 58. These include a pair of four-quadrant multipliers 53, 54 each having two inputs and deriving an output, a crystal stabilized voltage controlled oscillator 56, operating at color subcarrier frequency, a phase shift network 57, a gated automatic color control amplifier and filter 55, the color killer 58, the source 50 of the burst and chrominance information, the high pass filter 51 and the novel AGC (automatic gain control) amplifier 52.

The source 50 supplies chrominance and burst through the high pass filter 51, normally comprising primarily an undersized coupling capacitor (50 pf), to the AGC amplifier 52. The output of 52 is supplied to one set of inputs of each four-quadrant multiplier. The crystal stabilized, voltage controlled oscillator 56 is coupled normally without phase shift to the other set of inputs of the four-quadrant multiplier 53, and through the phase shift network 57 to the other set of inputs of the four-quadrant multiplier 54.

During video, assuming that the voltage controlled oscillator produces a wave of color subcarrier frequency in correct phase, the four-quadrant multiplier 53 functions as a demodulator producing a product term in its output which contains the demodulated (B - Y) color signal. Simultaneously, the four-quadrant multiplier 54 functions as a demodulator producing a product term in its output which contains the demodulated R - Y color signal. These two color difference signals are subsequently matrixed with the luminance (Y) signal to obtain the requisite R, G, B color signals required for operation of the picture tube in a color television receiver.

During burst, the locally supplied oscillator wave is properly in phase with the color burst, the four-quadrant multiplier 53 produces a D.C. color amplitude control signal whose amplitude is proportional to the amplitude of the color burst. The burst and the VCO (voltage controlled oscillator) input to the B - Y demodulator 53 are nearly in the same phase, usually differing by less than 20° (dependent upon the setting of a tint control (not shown) which permits a variation in detection angles). Since the output is a cosine function of the detection angle, the amplitude of the product term derived by the demodualtor 53 is relatively insensitive to any small angular changes between them. The control signal derived from the demodulator 53 is then applied to the gated ACC (automatic color control) amplifier and filter 55. The amplifier 55 is gated at its input to derive a control signal only during burst. The gain of the ACC amplifier in its production of a D.C. control signal is adjusted by an outboarded potentiometer. Another potentiometer connected with the amplifier 55 sets the color killer threshold. Manual color control, as distinguished from automatic color control, is normally provided by a gated control of the oscillator injection into both demodulators. During video, the injection is subject to the manual control, while during burst the injection is at full gain. The automatic color control voltage from 55 is then applied to the novel AGC amplifier 52 to hold the gain of the color signal injected into the demodulators 53 and 54 at a preset level. The automatic color control thus stabilizes the color amplitude in the demodulated picture at any arbitrary level set by the manual control.

The automatic color control has a second function. If the automatic color control voltage 55 falls below a preset threshold value, denoting a weakening in the color portion of the video signal or its total absence, the color killer 58 in which this threshold is set, is actuated and prevents VCO injection into the demodulators 53 and 54 during video. The color killer by a gated control (not shown) continues injection during burst, and thus is able to permit renewed VCO injection during video, whenever the color control voltage exceeds the desired threshold.

As implied above, the color demodulation and automatic color amplitude control functions entail the use of the demodulators 53, 54 on a time shared or time multiplexed basis and using gating controls strategically placed in the various functional elements, gating is possible because of the alternating transmission of video and control signals.

The local source 50 provides a demodulated video signal to the color demodulators 53, 54 suitable for time multiplexed operation. The video output waveform of source 50 is illustrated in FIG. 1 with some horizontal scale distortion, exaggerating the horizontal blanking interval. The waveform may be seen to include the horizontal synchronizing pulses, the color burst, followed by the video portion of the signal. While not evident from the illustration, the video portion of the waveform contains the chrominance information modulated upon a suppressed color subcarrier (at approximately 3.59 megacycles). Normally, it is desirable that the chrominance portion of the video signal appear at essentially full bandwidth and without attenuation at the input of the chrominance demodulators. The luminance portion of the signal may also be present but is unnecessary in this portion of the circuit and often undesirable. Normally, the luminance is attenuated in respect to the chrominance, the attenuation being less with more linear color demodulators. A suitable demodulated video waveform is normally available in any television receiver after video detection and prior to blanking. The specific time multiplexed color demodulator configuration so far described is not itself a part of the present invention but is the subject of copending application of Mr. William Peil et al., entitled "Multiplex Color Television Demodulator," Ser. No. 282,442 filed August 21, 1972, assigned to the Assignee of the present application and filed concurrently herewith.

When such a signal as that provided by source 50 is applied to the demodulators 53, 54 together with a wave of subcarrier frequency, they process both the video signal to derive the color signal and the burst to derive an automatic color amplitude control signal. These two elements of the signal may be separated by suitable gating.

Figure 2:
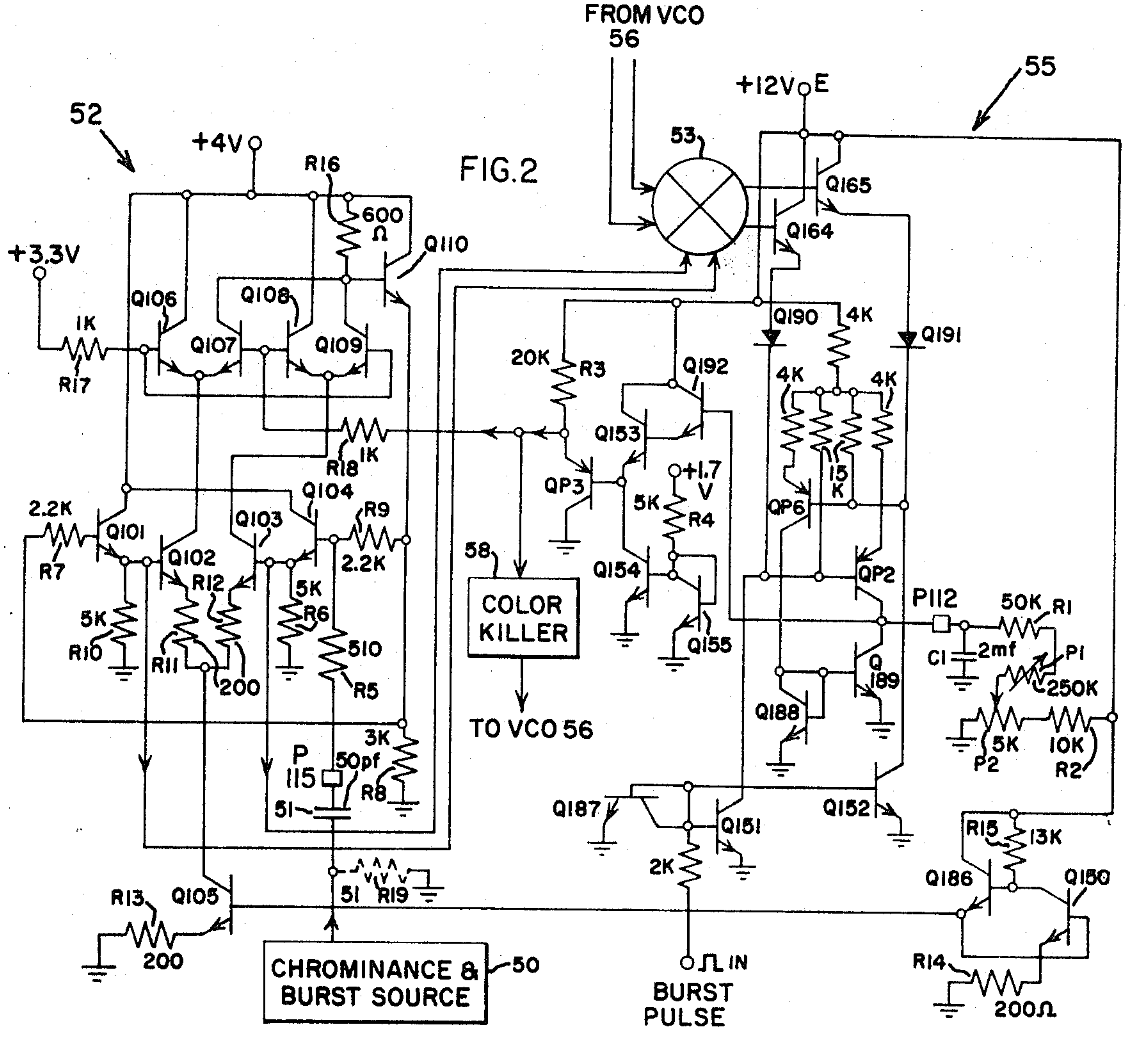
FIG. 2 is an illustration of a portion of the television receiver illustrated in FIG. 1 in block diagram but particularizing the circuit details of the automatic gain control amplifier and the principal elements of the automatic color control network incorporating the automatic gain control amplifier.

Let us now consider the automatic color amplitude control network in greater detail. FIG. 2 illustrates the color control network with circuit details being provided for the ACC amplifier and filter 55 and for the novel AGC amplifier 52. The VCO 56, phase shift network 57, and R - Y demodulator 54 have been omitted in FIG. 2, while the blocks 50, 53 and 58 have been retained in block form. Block 51 of FIG. 1 is merely the illustrated coupling capacitor in FIG. 2.

The ACC amplifier and filter 55 of FIG. 2 is coupled to the emitter followers Q164 and Q165 for deriving a sample of the complemented B - Y demodulator outputs during burst. The output of the amplifier portion of 55 is coupled to the external ACC filter at the pad P112 and the filtered output is coupled through a load isolation network comprising transistors QP3, Q153, Q192, Q154 and Q155 to the AGC amplifier 52. Gating within amplifier 55 permits multiplier output sensing only during burst and a noise balancing configuration provides a high degree of noise immunity to the ACC circuit.

Considering the circuit details of the amplifier 55: the transistors QP2, QP6, Q187, Q188, Q189, Q151, Q152, diodes Q190 and Q191, and sundry resistances make up the circuit components of the gate and amplifier proper. The emitter of Q164 couples demodulated burst through isolation diode Q190 to the base of transistor QP2, while the emitter of Q165 couples the complemented demodulated burst through isolation diode Q191 to the base of QP6.

The isolation diodes Q190, Q191 provide the gating action. They are controlled to admit signal currents only during burst by a gating circuit which entails a 2K ohm resistor which is coupled to a source of positive going burst pulses (not shown), a diode connected transistor Q187, which provides a (Veb) current reference, and transistors Q151, Q152 whose current is set by this current reference. The isolation diode Q190 derives its current through the collector of Q151 while the diode Q191 derives its current through the collector of transistor Q152. During burst, the transistors Q151 and Q152 are turned on by the burst pulse, allowing signal current to flow through isolation diodes Q190 and Q191 and samples of the demodulated burst to be coupled to the bases of transistors QP6 and QP2. The burst pulse waveform is illustrated in FIG. 1 adjacent the ACC amplifier 55.

The transistors QP2, QP6 and Q189 provided the amplification function in 55. Transistors QP2 and QP6 are biased by suitable resistances coupled to their bases and to their emitters including a common emitter resistance connected to a source of positive bias potential for differential amplifier operation. The collector of QP2 is connected to the pad P112 which leads to the ACC filter. The collector of QP6 is connected through diode connected transistor Q188 to ground and to the base of Q189. The diode Q188 furnishes a Veb current control for NPN transistor Q189 matching its current to that of QP6. The collector of Q189 is also connected to the pad P112, thus combining the output of both QP2 and Q189 in push-pull across the ACC amplifier load.

The "burst," which in the demodulator outputs forms a complemented D.C. signal at the output of Q164, Q165, is amplified by the differential pair QP2, QP6 to form a D.C. control signal, and applied in push-pull by QP2, Q189 to the ACC load at pad P112. If the signal polarity makes the base of transistor QP6 more positive than the base of QP2, transistor QP6 becomes less conductive, as well as transistor Q189. At the same time, a complementary negative potential is applied at the base of PNP transistor QP2 increasing its conductivity. The complementary transistors QP2 and Q189 are serially connected between the positive bias source and ground and the ACC load is coupled at their paired collectors. Thus, increased conductivity in QP2 is accompanied by decreased conductivity in Q189, bringing about an increase in D.C. potential available at the pad P112 corresponding to push-pull operation.

The circuit is normally operated with an input signal phase relationship that brings about a positive output at the pad P112 in response to the burst. The potentiometer P1 determines the D.C. gain of the amplifier 55 and thereby the amount of control potential produced for a given amount of burst in the detector output.

"Noise" in the demodulator outputs, which is balanced to ground in both signal paths, is normally self-cancelling. This is readily shown by noting that if both transistors QP2 and QP6 share a D.C. offset of the same polarity (as from noise), a conductivity in one (for instance QP2) will increase while conductivity in the other (QP6) and Q189 which is made equal to QP6, will incur a corresponding increase, producing little or no net change in output voltage. In addition to this common mode noise cancelling, the filter capacitor averages to zero any high frequency noise components appearing during the burst interval.

The output of the ACC amplifier is applied at P112 to the filter and control elements. The filter of the AGC amplifier 55 comprises the non-integrable elements including a 2 mf storage capacitor C1 and a pair of potentiometers P1 and P2 mentioned earlier and a pair of fixed resistances R1, R2. The capacitor C1 is coupled between the pad P112 and ground. A resistance R1 is provided connected in series with the potentiometer P1 between the pad P112 and a tap on the potentiometer P2. The potentiometer P2 is in turn connected in series with R2 and a 12 volt source of bias potential. The 250 K ohm potentiometer P1, which constitutes a variable amplifier load resistance and thereby a direct control of its gain, permits one to adjust the output level of the ACC circuit in relation to a given burst level in the detector output.

The potentiometer P2 permits one to adjust the signal threshold at which the color killer 58 operates. The color killer itself has a "fixed" D.C. threshold. However, a variation in the position of the tap on P2 adjusts the amount of D.C. added to the demodulated D.C. potential derived from the burst. Thus, as one varies the D.C. added by adjusting P2, the burst derived voltage required to exceed the fixed threshold is correspondingly varied.

After filtering, the ACC voltage from 55 is coupled to the color killer 58 and AGC amplifier 52 through an impedance isolation network comprising the transistors QP3, Q153, Q192, Q154, Q155 and resistances R3 and R4. The filtered ACC control signal at pad P112 is coupled to the base of emitter follower Q192, the input transistor of the isolation network. The collector of Q152 is coupled to B+ and its emitter is coupled to the base of transistor Q153. Q153 is also in an emitter following configuration with its collector connected to B+ and its emitter led to the collector of transistor Q154 acting as a constant current source. The emitter of Q154 is grounded and its base coupled to a $V_{(eb)}$ reference potential established by R4 and diode connected Q155, the two being coupled between a low bias source (+1.7V) and ground. The output of the impedance isolating network appears at the emitter of PNP transistor QP3, also connected in emitter follower configuration. The base of QP3 is connected to the emitter of Q153. The collector of QP3 is grounded, and its emitter is led through load resistance R3 to the high positive bias source (+12 V).

The impedance isolating network thus uses three successive emitter following stages and couples the filtered ACC voltage from the pad P112 to the color killer 58 and to the AGC amplifier 52, whose detailed circuit will now be described.

The AGC amplifier 52 comprises the circuitry associated with the transistors Q101 through Q110. Summarizing: the transistors are connected in a modified four-quadrant multiplier configuration with lower and upper ranks of transistors. The lower rank transistors Q101 to Q104 drive the upper rank transistors Q106 through Q109 through collector to emitter connections. The chrominance and burst input from the source 50 is applied to the base of one lower rank transistor Q104. The output of the upper rank transistors (Q106 through Q109), dependent upon the magnitude of the automatic color control voltage, is applied as either regenerative or degenerative feedback through output emitter follower transistor Q110 to the lower rank transistors to effect gain control. The normal range of gain is from +9 db to −6 db. The amplitude stabilized chrominance and burst output of 52 is derived from the emitter loads of lower rank input transistors Q104 and Q101.

Considering the AGC amplifier circuit configuration in detail: the chrominance and burst input signal from the source 50 is coupled through capacitor 51, acting as a high pass filter to the chrominance input pad P115. The source 50 has a nominal internal resistance of 51 ohms as shown by the dashed resistance R19. The chrominance input pad P115 is connected through input resistance R5 to the base of lower rank transistor Q104.

Flanking lower rank transistors Q104, Q101 drive inner transistor pair Q103, Q102, respectively. Lower rank transistor Q104 is connected in an emitter follower configuration with its collector led to a low (4.0 volt) positive bias potential and its emitter is led to ground through load resistance R6. Lower rank transistor Q101, also connected in emitter follower configuration, is not coupled for direct receipt of the input signal but does receive a feedback signal containing chrominance and burst information as will be described. Transistor Q101 has its collector connected to a source of low (4.0 volts) positive bias potential, its emitter led to ground through resistances R10, and its base connected through a resistance R7 to one terminal of feedback load resistance R8. The other terminal of R8 is grounded. The base of transistor Q104 is also connected through resistance R9 to the ungrounded terminal on feedback resistance R8. The emitters of Q104 and Q101 are then connected to the bases of Q103, Q102 for signal coupling thereto.

Paired lower rank transistors Q102 and Q103 form a differential amplifier to whose bases an input signal from emitter followers Q101 and Q104 is applied as noted, and whose collectors in turn apply an output signal to the of the upper rank transistors. Each transistor Q102, Q103 has an emitter resistance R11, R12, respectively, coupled to the collector of constant current source Q105. Q105 has its emitter returned to ground through resistance R13 and its base connected to a stable voltage source comprising transistors Q186, Q150 and resistances R14, R15. The connection of the emitters of Q102 and Q103 to the current source causes formation in Q102 of an out of phase signal current equalling that applied to Q103 (and the converse is also true). The collectors of transistors Q102 and Q103 are coupled respectively to the emitters of upper rank transistors Q106, Q107 and Q108, Q109, respectively, for signal application.

The upper rank transistors which have chrominance and burst coupled to their emitters, as noted above, produce an output at the upper rank collectors which reflects the automatic color control voltage applied to their bases. The collectors of upper rank transistors Q106 and Q108 from which no output is derived, are joined and led to the 4 volt source of fixed positive bias. The collectors of upper rank transistors Q107 and Q109 from which an output is selectively derived, are also joined and led through load resistance R16 to the same 4 volt source of positive bias potentials. The bases of transistors Q106 and Q109 are paired and led to a stable 3.3 volt reference source through the resistance R17. The bases of transistors Q107 and Q108 are coupled through resistance R18 to the to the emitter of PNP transistor QP3 from which the automatic color control voltage is supplied. Thus, the base excitation is poled for balanced operation at the output collectors.

The automatic color control voltage distributes the signal between one upper rank transistor pair and the other in a continuous fashion. The control voltage is applied with the 3.3 volt reference source in a "balanced" fashion to the bases of Q106, Q109. The ACC voltage varies continuously from a value typically 150 millivolts below the 3.3 volts reference source to a value typically 150 millivolts above the reference source. Assuming that the ACC voltage is sufficiently less positive than the reference to cut off Q107, Q108, then Q106, Q109 will be turned on. Since the signal output is derivable only from Q107, Q108, the effect of this low or less positive interbase potential is to switch the output signal to the path through Q109. Similarly, when the ACC voltage is higher or more positive than the ACC voltage, the signal path is through Q107. Since the voltage may vary continuously between the upper and lower limits, the output signal may also be continuously varied from a condition in which the signal is all in one path, to a condition in which it is partly in one path and partly in the other path, to a final condition in which it is all in the other path.

The foregoing configuration functions in a mode resembling four-quadrant action. Assuming that the base of lower rank transistor Q104 is excited with the input chrominance and burst signal, an out of phase signal will appear at the collector of Q103 while a complemented (in phase) signal voltage will appear at the collector of lower rank transistor Q102. Thus, the paired emitters of upper rank transistors Q106, Q107 and Q108, Q109 will be differentially excited with in and out of phase chrominance and burst. When the ACC voltage applied to the bases of upper rank transistors Q107 and Q108 become less positive than the fixed bias voltage on the bases of Q106 and Q109, turning on the output transistor Q109, an increase in out of phase signal voltages will appear in the output load resistance R16. Conversely, if the automatic color control voltage exceeds the fixed 3.3 volt bias, the output transistors Q107 will be turned on causing an increase in in phase signal voltages to appear in the output load resistance R16. Since the signal voltages derived in the collector load resistance R16 are opposite in phase as between output transistors Q107 and Q109, the magnitude and phase of the resultant output signal voltage of upper rank transistors will change — dependent on the ACC bias, and if applied as feedback to the base of Q104, the effect will vary from regeneration to degeneration.

The output of the upper rank transistors of the AGC amplifier is connected to the input of both lower rank transistors to provide such feedback. The collector load resistance R16 is connected to the base of output emitter follower Q110, whose collector is connected to 4.0 volt positive potential and whose emitter is led to feedback load resistance R8. This connection provides both A.C. and D.C. feedback paths from the output load of the upper rank transistors to both flanking lower rank input transistors.

The feedback circuit provides control of the A.C. gain of the amplifier with an essentially zero effect upon the D.C. gain. This relationship is achieved by an input circuit balanced for D.C. feedback (so that the feedback is self-cancelling) and unbalanced for A.C. feedback. As previously noted, the pad P115, the chrominance input point, is coupled through a 50 picofarad capacitor 51 to a low impedance source illustrated by dotted virtual resistance R19. The impedance of R19 is normally about 50 ohms as illustrated. A 510 ohm resistance (R5) connects the pad P115 to the base of Q104.

For D.C. feedback, the feedback voltage appearing in the feedback load resistance R8 is led to the bases of Q101 and Q104 through equal 2.2K resistances. The capacitor 51 presents an infinite impedance to the low source impedance coupled to the base of Q104, and no D.C. impedance imbalance results. Thus, for D.C., under all interbase adjustments, the feedback at Q101 and Q104 will produce equal "common mode" output signal voltages in the output loads R10 and R6 of the AGC amplifier, i.e., both will be in the same polarity and magnitude with respect to ground. The capacitor 51 prevents any external D.C. signal from affecting this condition. Noting that the output of the AGC amplifier is derived differentially between the bases of Q102, Q103, the "common mode" feedback signal is thus rejected or self-cancelling. In short, the D.C. gain (within the amplifier) is substantially unaffected by the feedback provisions (and is essentially unity).

For A.C. feedback, however, particularly at the color subcarrier frequency, the base of Q104 is in a lower impedance configuration than Q101 and thus receives less feedback voltage. In particular, the external source impedance R19 appears as a near short circuit, while the rest of the input connected to Q104 appears as a 510 ohm resistance with an approximately 1,000 ohm capacitive reactance (at subcarrier frequency) shunting the base to ground. These elements, depending upon other parameters of the amplifier, provide an impedance at the base of Q104 that is at times appreciably lower and never greater than at the base of Q101. Thus, the differential effect of the feedback favors that applied at Q101. If the control voltage increases positively, turning on Q107, an in phase signal will be applied in the feedback network. In Q104, Q105 it will tend to cause regeneration, offset by a larger degenerative effect at Q101, Q102. The net effect upon the AGC output, which rejects the common mode element, is a gain reduction. If the control voltage decreases, turning on Q109, an out of phase signal will be applied in the feedback network, and it will primarily cause regeneration in Q101, Q102 and an increase in gain.

The output of the AGC amplifier is derived between the bases of Q102, Q103 and reflects the composite affect of direct signal application to Q103 and internal feedback to both Q102, Q103 under D.C. control. Using the indicated amplifier parameters, the AGC amplifier exhibits a full gain of approximately 10 db. At full gain the amplifier exhibits a frequency selectivity peak at 3.58 megacycles with a bandwidth of about 3 megacycles. At minimum gain (6 db attenuation) the amplifier exhibits an essentially linear gain characteristic from 1 megacycle to 10 megacycles.

A mathematical analysis of the circuit shows that the frequency peak $\omega_p$, which approximates the geometric mean of the product $\omega_t$ and $\omega_o$:

$$\omega_p \sim \sqrt{\omega_o \cdot \omega_t} \quad (1)$$

where $\omega_o$ is the upper cut off frequency of the amplifier, typically $30\pi M$ radians or 15 MHz, and $\omega_t$, the low pass cut off frequency of the feedback network, being defined:

$$\omega_t = 1/C_s\,(R_s + R_{ts} + R_f) \quad (2)$$

where $C_s$ is the signal coupling capacitance $C_{51}$ (50 pf),
$R_s$ is the serial signal coupling resistance $R_5$ (510 ohms),
$R_{ts}$ is the internal source resistance illustrated by $R_{19}$ (51 ohms), and
$R_f$ is the feedback resistance $R_9$ (2.2 K ohms).

An examination of expression (2) indicates that $\omega_p$ can be "tuned" to the proper center frequency by adjusting capacitor 51.

The conditions for stability dictate that the D.C. gain ($A_o$) from the base of Q104 to the emitter output of Q110 be close to unity (normally less than 1.3 with the indicated circuit values). Mathematically:

$$A_o < (1 + R_s + R_{ts}/R_f + \omega_1/\omega_o) \quad (3)$$

Where $$\omega_1 = 1/R_f\,C_s \quad (4)$$

Since $\omega_1/\omega_o$ in expression (3) is small in relation to the first two terms, the limiting gain is conservatively $$A_o < (1 + R_s + R_{ts}/R_f) \quad (5)$$

An examination of expression (5) shows that stable gain is controlled by the signal ($R_s$) and feedback ($R_f$) resistances, and the internal resistance ($R_{ts}$) of the source 50. Normally, the $R_{ts}$ should be small, preferably less than 100 ohms, in the intersts of gain.

The complete transfer characteristic ($A_c$) of the AGC amplifier from $e_i$ to $e_o$ may be defined mathematically as follows:

$$A_c = e_o/e_i = (S/\omega_1)\ (1 + S/\omega_o)/S^2/\omega_i\omega_o + S(1/\omega_i + 1/\omega_o - \gamma A_o/\omega_1) + 1 \qquad (6)$$

Where
$S$ = complex frequency
$S = j\ \omega$ for sinusoidal amplifier response
$-1 \leq \gamma \leq +1$ is the feedback factor.

The invention should not be regarded as confined to the precise details disclosed by way of example, since many modifications may be made without departure from the inventive principles.

While the lower rank transistors in the differential configuration are flanked by emitter followers in certain applications, they may not be required. In the illustrated configuration they provide useful but not essential isolation to the feedback network. While the output has been derived from the bases of the lower rank transistors Q102, Q103, the output may also be derived from their emitters. This would, however, provide a load dependent gain. The circuit values should be regarded as exemplary. These choices are subject to normal modifications dependent upon the precise application of the invention.

The invention is disclosed in an application wherein the gain control function is introduced in an automatic gain control network for stabilizing the color portions of a television signal. One need not use the invention in such an automatic network, but one may use the voltage control for direct gain control.

The arrangement is ideally adapted for the color television application and in particular to an integrated mode of assembly. The active circuits and major passive components are integrable, and the pin requirement and external component count are minimal. In the embodiment illustrated, a single external pin (P115) is required to couple the chrominance signal to the AGC amplifier and a single pin is needed for the ACC filter. The external components required for the AGC amplifier are nil - unless one includes the serial coupling and filter capacitor 51. The ACC filter has several components, which, as noted, perform the filtering, ACC adjustment and color killer adjustment.

What we claim as new and desire to secure by Letters Patent of the United States is:

1. An amplifier of controllable A.C. signal gain comprising:

a. a first and a second pair of transistors in an upper rank, the emitters of each transistor pair being joined; one collector of a transistor in each pair being joined and coupled to a source of D.C. bias potential, and the collector of the other transistor in each pair being joined and coupled through a common load impedance to a source of D.C. bias potentials, b. a lower rank transistor pair having its emitters paired and led to a current source for mutually complemented signal coupling, the collector of each lower rank transistor being connected to control the emitter current in one upper rank transistor pair;

c. means coupling an A.C. input signal to the base of a first lower rank transistor, said coupling means having a high pass characteristic and presenting a complex input impedance to said base, said lower rank transistors forming mutually complemented signals in the emitter current of each upper rank transistor pair, d. means for applying a D.C. interbase control potential to each upper rank transistor pair, balanced at said collector load impedance, for adjusting the relative proportions of said complemented signals in the composite signal in said load, e. means for coupling said composite signal to both bases of said lower rank transistors in a feedback network which is symmetrical from a D.C. standpoint to provide negligible interbase potential and which from an A.C. standpoint is nonsymmetrical at signal frequencies, as a result of imbalance by said complex input impedance, to provide substantial interbase feedback potential, the amount and phase thereof being adjustable by said interbase control potential, and f. output means coupled between like input electrodes of said lower rank transistor pair for deriving an output signal whose amplitude reflects said interbase control potential.

2. An amplifier as set forth in claim 1 wherein said high pass coupling means comprises a serially connected capacitance ($C_s$) and resistance coupling said input signal to the base of said first transistor and presenting a low pass characteristic to said feedback.

3. An amplifier as set forth in claim 2 wherein said feedback network comprises an emitter follower whose base is coupled to said common load impedance and whose emitter is coupled to each lower rank transistor base through a like valued serial feedback resistance.

4. An amplifier as set forth in claim 3 wherein a pair of emitter followers is provided for coupling the feedback signal available through said serial feedback resistances to the bases of said lower rank transistors, and wherein said output means are coupled between the bases of said lower rank transistor pair.

5. An amplifier as set forth in claim 4 wherein the forward gain ($A_{(o)}$) of said amplifier calculated between the base of said first lower rank transistor and the emitter of said emitter follower is less than one (1) plus the ratio of said serial signal resistance ($R_s$) and the internal source resistance ($R_{is}$) to said serial feedback resistance ($R_f$)

$$A_o < (1 + R_s + R_{is}/R_f).$$

6. An amplifier as set forth in claim 5 wherein the geometric means of the cut off frequency of the amplifier ($\omega_o$) and the cut off frequency of said feedback network ($\omega_i$) approximates the center signal frequency, the cut off frequency of said feedback network being defined as:

$$\omega_i = 1/C_s\ (R_s + R_{is} + R_f)$$

to cause the amplifier to have a frequency selective characteristic peaking at said center signal frequency at maximum gain condition.

* * * * *